United States Patent
Shigeta

(10) Patent No.: US 10,995,223 B2
(45) Date of Patent: May 4, 2021

(54) FIBROUS CARBON NANOSTRUCTURE DISPERSION LIQUID

(71) Applicant: ZEON CORPORATION, Tokyo (JP)

(72) Inventor: Masahiro Shigeta, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 16/063,807

(22) PCT Filed: Dec. 21, 2016

(86) PCT No.: PCT/JP2016/088239
§ 371 (c)(1),
(2) Date: Jun. 19, 2018

(87) PCT Pub. No.: WO2017/115708
PCT Pub. Date: Jul. 6, 2017

(65) Prior Publication Data
US 2019/0161628 A1 May 30, 2019

(30) Foreign Application Priority Data
Dec. 28, 2015 (JP) .............................. JP2015-255802

(51) Int. Cl.
*H01B 1/04* (2006.01)
*H01B 1/14* (2006.01)
*C08K 3/04* (2006.01)
*C01B 32/00* (2017.01)
*C09D 5/24* (2006.01)
*C09D 1/00* (2006.01)
*C01B 32/174* (2017.01)
*C09D 7/40* (2018.01)
*B82Y 30/00* (2011.01)
*H01L 51/00* (2006.01)

(52) U.S. Cl.
CPC .............. *C09D 5/24* (2013.01); *C01B 32/174* (2017.08); *C09D 1/00* (2013.01); *C09D 7/70* (2018.01); *B82Y 30/00* (2013.01); *C01B 2202/22* (2013.01); *C01B 2202/28* (2013.01); *C01B 2202/30* (2013.01); *C01B 2202/36* (2013.01); *C01P 2006/11* (2013.01); *C01P 2006/80* (2013.01); *C08K 3/041* (2017.05); *H01L 51/0007* (2013.01); *H01L 51/0048* (2013.01)

(58) Field of Classification Search
CPC ... H01B 1/24; H01B 1/04; H01B 1/14; B82Y 30/00; B82Y 40/00; H01M 4/625; H01M 4/583; H01M 4/9083; H01M 4/96; C01B 32/00; C08K 3/04; C08K 3/046
See application file for complete search history.

(56) References Cited

U.S. PATENT DOCUMENTS

| 7,556,746 | B2 | 7/2009 | Sen et al. | |
| 7,858,185 | B2 | 12/2010 | Sen et al. | |
| 9,748,016 | B2* | 8/2017 | Shigeta | B82Y 30/00 |
| 9,911,975 | B2* | 3/2018 | Kim | H01M 4/366 |
| 2008/0318049 | A1 | 12/2008 | Hata et al. | |
| 2014/0332731 | A1* | 11/2014 | Ma | C09D 5/24 |
| | | | | 252/506 |
| 2016/0159652 | A1* | 6/2016 | Uejima | C08J 3/2053 |
| | | | | 252/511 |
| 2016/0229695 | A1 | 8/2016 | Yoshiwara | |
| 2016/0251225 | A1 | 9/2016 | Takai et al. | |
| 2017/0256791 | A1* | 9/2017 | Kurita | C04B 35/83 |

FOREIGN PATENT DOCUMENTS

| TW | I300046 B | 8/2008 | |
| WO | 2006011655 A1 | 2/2006 | |
| WO | WO-2013080912 A1 * | 6/2013 | ............. B82Y 30/00 |
| WO | WO-2015015758 A1 * | 2/2015 | ............. C08J 3/2053 |
| WO | 2015045418 A1 | 4/2015 | |
| WO | WO-2015056925 A1 * | 4/2015 | .......... H01M 2/1653 |
| WO | 2015064772 A1 | 5/2015 | |
| WO | WO-2016017583 A1 * | 2/2016 | ........ H01M 10/0525 |

OTHER PUBLICATIONS

Jul. 3, 2018, International Preliminary Report on Patentability issued in the International Patent Application No. PCT/JP2016/088239.
Jan. 31, 2017, International Search Report issued in the International Patent Application No. PCT/JP2016/088239.

* cited by examiner

*Primary Examiner* — Haidung D Nguyen
(74) *Attorney, Agent, or Firm* — Kenja IP Law PC

(57) ABSTRACT

A fibrous carbon nanostructure dispersion liquid having excellent dispersibility of fibrous carbon nanostructures is provided. A fibrous carbon nanostructure dispersion liquid comprises: fibrous carbon nanostructures with a tap density of 0.024 g/cm$^3$ or less; and a solvent.

7 Claims, No Drawings

FIBROUS CARBON NANOSTRUCTURE DISPERSION LIQUID

TECHNICAL FIELD

The present disclosure relates to a fibrous carbon nanostructure dispersion liquid.

BACKGROUND

In recent years, fibrous carbon materials and especially fibrous carbon nanostructures such as carbon nanotubes (hereafter also referred to as "CNTs") have been attracting attention as materials excellent in electrical conductivity, thermal conductivity, and mechanical characteristics.

However, fibrous carbon nanostructures such as CNTs are fine structures with diameters in nanometer size, and therefore are poor in handleability and processability when used alone. Accordingly, for example, it has been proposed to produce a solution having CNTs dispersed therein, apply the solution to a substrate or the like to cause a plurality of CNTs to aggregate in film form and thus form a carbon nanotube film (hereafter also referred to as "CNT film") which is also called "buckypaper", and use the CNT film as a conductive film or the like. As the coating liquid having CNTs dispersed therein, for example, a coating liquid obtained by dispersing CNTs of high purity in a solvent is known (see PTL 1).

CITATION LIST

Patent Literatures

PTL 1: the specification of U.S. Pat. No. 7,556,746 B2

SUMMARY

Technical Problem

However, the coating liquid described in PTL 1 decreases in absorbance and does not have sufficient dispersibility of CNTs, because aggregation of CNTs is facilitated as a result of pretreatment being performed in order to increase the purity of CNTs. A CNT film formed using such a coating liquid with insufficient dispersibility is poor in electrical conductivity and strength. There has thus been demand for a dispersion liquid containing fibrous carbon nanostructures with excellent dispersibility.

It could therefore be helpful to provide a fibrous carbon nanostructure dispersion liquid having excellent dispersibility of fibrous carbon nanostructures.

Solution to Problem

The inventor conducted extensive studies to achieve the object, and discovered that a dispersion liquid having excellent dispersibility of fibrous carbon nanostructures can be obtained by using specific fibrous carbon nanostructures.

To advantageously solve the problems stated above, a presently disclosed fibrous carbon nanostructure dispersion liquid comprises: fibrous carbon nanostructures with a tap density of 0.024 g/cm$^3$ or less; and a solvent. Such a dispersion liquid has excellent dispersibility of fibrous carbon nanostructures. Herein, the tap density is a value measured in accordance with JIS Z2512.

Preferably, the presently disclosed fibrous carbon nanostructure dispersion liquid substantially does not contain a dispersant. Such a dispersion liquid contains few impurities, and is capable of forming a carbon film having higher electrical conductivity and strength. Moreover, the dispersion liquid has better dispersibility of fibrous carbon nanostructures.

Preferably, in the presently disclosed fibrous carbon nanostructure dispersion liquid, a concentration of the fibrous carbon nanostructures in 1 L of the solvent is 1 mg/L or more. Such a dispersion liquid is capable of forming a carbon film having higher electrical conductivity and strength.

Preferably, the presently disclosed fibrous carbon nanostructure dispersion liquid substantially dos not contain particles with a number-based mode diameter of more than 500 nm. Such a dispersion liquid contains few impurities, and is capable of forming a carbon film having higher electrical conductivity and strength. Moreover, the dispersion liquid has better dispersibility of fibrous carbon nanostructures.

Preferably, the presently disclosed fibrous carbon nanostructure dispersion liquid substantially does not contain particles with a number-based mode diameter of more than 300 nm. Such a dispersion liquid contains few impurities, and is capable of forming a carbon film having higher electrical conductivity and strength. Moreover, the dispersion liquid has better dispersibility of fibrous carbon nanostructures.

Preferably, in the presently disclosed fibrous carbon nanostructure dispersion liquid, a concentration of metal impurities is less than $1\times10^{18}$ atoms/cm$^3$. Such a dispersion liquid contains few impurities, and is capable of forming a carbon film having higher electrical conductivity and strength. Moreover, the dispersion liquid has better dispersibility of fibrous carbon nanostructures.

Preferably, in the presently disclosed fibrous carbon nanostructure dispersion liquid, the concentration of metal impurities is less than $15\times10^{10}$ atoms/cm$^3$. Such a dispersion liquid contains few impurities, and is capable of forming a carbon film having higher electrical conductivity and strength. Moreover, the dispersion liquid has better dispersibility of fibrous carbon nanostructures.

Preferably, the presently disclosed fibrous carbon nanostructure dispersion liquid substantially does not contain a precipitate and an aggregate of the fibrous carbon nanostructures. Such a dispersion liquid contains few impurities, and is capable of forming a carbon film having higher electrical conductivity and strength. Moreover, the dispersion liquid has better dispersibility of fibrous carbon nanostructures.

Preferably, the presently disclosed fibrous carbon nanostructure dispersion liquid is used as a constituent material of a semiconductor device.

Advantageous Effect

It is therefore possible to provide a fibrous carbon nanostructure dispersion liquid having excellent dispersibility of fibrous carbon nanostructures.

DETAILED DESCRIPTION

One of the disclosed embodiments is described in detail below.

(Fibrous Carbon Nanostructure Dispersion Liquid)

A presently disclosed fibrous carbon nanostructure dispersion liquid contains fibrous carbon nanostructures with a tap density of 0.024 g/cm$^3$ or less and a solvent.

In the case of using conventional carbon nanotubes, aggregates form after removing metal impurities by acid treatment or the like or removing particulate impurities by filtration or the like, which causes a decrease in absorbance and poor dispersibility. The presently disclosed fibrous carbon nanostructure dispersion liquid, on the other hand, contains fibrous carbon nanostructures with a tap density of 0.024 g/cm³ or less. Hence, aggregation structures upon treatment start are loose, and, even after removing particulate impurities by filtration or the like, fibrous carbon nanostructures are unlikely to aggregate. The fibrous carbon nanostructure dispersion liquid thus has excellent dispersibility of fibrous carbon nanostructures.

<Fibrous Carbon Nanostructures>

Examples of the fibrous carbon nanostructures include carbon nanotubes and vapor-grown carbon fibers, without being limited thereto. One of these fibrous carbon nanostructures may be used individually, or two or more of these fibrous carbon nanostructures may be used in combination.

Of these, the fibrous carbon nanostructures are more preferably fibrous carbon nanostructures including carbon nanotubes. The use of fibrous carbon nanostructures including carbon nanotubes enables obtainment of a dispersion liquid capable of forming a carbon film having higher electrical conductivity and strength.

As used herein, "carbon film" refers to a film formed by an aggregate of fibrous carbon nanostructures such as carbon nanotubes.

The fibrous carbon nanostructures including carbon nanotubes that are suitable for use as the fibrous carbon nanostructures may be composed solely of carbon nanotubes, or may be a mixture of carbon nanotubes and fibrous carbon nanostructures other than carbon nanotubes.

The carbon nanotubes in the fibrous carbon nanostructures may include, but are not limited to, single-walled carbon nanotubes and/or multi-walled carbon nanotubes. The carbon nanotubes are preferably single- to up to 5-walled carbon nanotubes, and more preferably single-walled carbon nanotubes. In the case where single-walled carbon nanotubes are used, since single-walled carbon nanotubes are finer tubes (tubes with smaller diameter), a dispersion liquid capable of forming a flatter carbon film and also capable of forming a carbon film having higher electrical conductivity and strength in carbon film formation can be obtained, as compared with the case where multi-walled carbon nanotubes are used.

The fibrous carbon nanostructures are preferably carbon nanostructures for which a ratio ($3\sigma$/Av) of the diameter standard deviation ($\sigma$) multiplied by 3 ($3\sigma$) relative to the average diameter (Av) is more than 0.20 and less than 0.60, more preferably carbon nanostructures for which $3\sigma$/Av is more than 0.25, and further preferably carbon nanostructures for which $3\sigma$/Av is more than 0.50. The use of fibrous carbon nanostructures for which $3\sigma$/Av is more than 0.20 and less than 0.60 further enhances the dispersibility of fibrous carbon nanostructures in the obtained dispersion liquid, and enables obtainment of a dispersion liquid capable of forming a carbon film having higher electrical conductivity and strength.

Herein, the "average diameter (Av) of the fibrous carbon nanostructures" and the "diameter standard deviation ($\sigma$: sample standard deviation) of the fibrous carbon nanostructures" can each be obtained by measuring the diameters (external diameters) of 100 randomly selected fibrous carbon nanostructures using a transmission electron microscope. The average diameter (Av) and the standard deviation ($\sigma$) of the fibrous carbon nanostructures may be adjusted by changing the production method and the production conditions of the fibrous carbon nanostructures, or adjusted by combining a plurality of types of fibrous carbon nanostructures obtained by different production methods.

The fibrous carbon nanostructures that are typically used take a normal distribution when a plot is made of diameter measured as described above on a horizontal axis and probability density on a vertical axis, and a Gaussian approximation is made.

Furthermore, the fibrous carbon nanostructures preferably exhibit a radial breathing mode (RBM) peak when evaluated by Raman spectroscopy. Note that an RBM is not present in the Raman spectrum of fibrous carbon nanostructures composed only of multi-walled carbon nanotubes having three or more walls.

Moreover, in a Raman spectrum of the fibrous carbon nanostructures, a ratio (G/D ratio) of G band peak intensity relative to D band peak intensity is preferably 1 or more and 20 or less. If the G/D ratio is 1 or more and 20 or less, a dispersion liquid capable of forming a carbon film with excellent balance of electrical conductivity and strength and dispersibility of fibrous carbon nanostructures in the dispersion liquid can be obtained.

The average diameter (Av) of the fibrous carbon nanostructures is preferably 0.5 nm or more and further preferably 1 nm or more, and preferably 15 nm or less and further preferably 10 nm or less. If the average diameter (Av) of the fibrous carbon nanostructures is 0.5 nm or more, aggregation of the fibrous carbon nanostructures is suppressed, and the dispersibility of the fibrous carbon nanostructures in the fibrous carbon nanostructure dispersion liquid can be enhanced. If the average diameter (Av) of the fibrous carbon nanostructures is 15 nm or less, the dispersibility of the fibrous carbon nanostructures in the dispersion liquid can be further enhanced. Thus, by limiting the average diameter (Av) of the fibrous carbon nanostructures to the above-mentioned range, the dispersibility of the fibrous carbon nanostructures in the dispersion liquid can be further enhanced.

The average length of the fibrous carbon nanostructures at the time of synthesis is preferably 100 μm or more and 5000 μm or less. Fibrous carbon nanostructures that have a longer structure length at the time of synthesis tend to be more easily damaged by breaking, severing, or the like during dispersion. Therefore, it is preferable that the average length of the structures at the time of synthesis is 5000 μm or less.

The BET specific surface area of the fibrous carbon nanostructures is preferably 400 m²/g or more and more preferably 800 m²/g or more, and preferably 2500 m²/g or less and more preferably 1200 m²/g or less. If the BET specific surface area of the fibrous carbon nanostructures is 400 m²/g or more, the strength and free-standing ability of a carbon film formed using the dispersion liquid can be further enhanced. If the BET specific surface area of the fibrous carbon nanostructures is 2500 m²/g or less, the dispersibility of the fibrous carbon nanostructures in the dispersion liquid can be further enhanced.

As used herein, "BET specific surface area" refers to a nitrogen adsorption specific surface area measured by the BET method.

In accordance with the super growth method described later, the fibrous carbon nanostructures are obtained, on a substrate having thereon a catalyst layer for carbon nanotube growth, in the form of an aggregate wherein fibrous carbon nanostructures are aligned substantially perpendicularly to the substrate (aligned aggregate). The mass density of the fibrous carbon nanostructures in the form of such an aggregate is preferably 0.002 g/cm³ or more and 0.2 g/cm³ or less. A mass density of 0.2 g/cm³ or less allows the fibrous carbon nanostructures to be homogeneously dispersed in the fibrous carbon nanostructure dispersion liquid because binding among the fibrous carbon nanostructures in the liquid is weakened. A mass density of 0.002 g/cm³ or more improves the unity of the fibrous carbon nanostructures, thus preventing the fibrous carbon nanostructures from becoming unbound and making the fibrous carbon nanostructures easier to handle.

The fibrous carbon nanostructures preferably include a plurality of micropores. In particular, the fibrous carbon nanostructures preferably include micropores that have a pore diameter of less than 2 nm. The amount of these micropores as measured in terms of micropore volume determined by the method described below is preferably 0.40 mL/g or more, more preferably 0.43 mL/g or more, and further preferably 0.45 mL/g or more, with the upper limit being generally on the order of 0.65 mL/g. The presence of such micropores in the fibrous carbon nanostructures further suppresses aggregation of the fibrous carbon nanostructures in the liquid, and further enhances the dispersibility of the fibrous carbon nanostructures in the dispersion liquid. Micropore volume can be adjusted, for example, by appropriate alteration of the production method and the production conditions of the fibrous carbon nanostructures.

Herein, "micropore volume (Vp)" can be calculated using Equation (I): $Vp=(V/22414)\times(M/\rho)$ by measuring a nitrogen adsorption and desorption isotherm of the fibrous carbon nanostructures at liquid nitrogen temperature (77 K) with the amount of adsorbed nitrogen at a relative pressure P/PO=0.19 defined as V, where P is a measured pressure at adsorption equilibrium, and PO is a saturated vapor pressure of liquid nitrogen at time of measurement. In Equation (I), M is a molecular weight of 28.010 of the adsorbate (nitrogen), and $\rho$ is a density of 0.808 g/cm³ of the adsorbate (nitrogen) at 77 K. Micropore volume can be measured, for example, using BELSORP®-mini (BELSORP is a registered trademark in Japan, other countries, or both) manufactured by Bel Japan Inc.

The fibrous carbon nanostructures preferably exhibit a convex upward shape in a t-plot obtained from an adsorption isotherm, in terms of further enhancing the dispersibility in the dispersion liquid and enabling obtainment of a dispersion liquid capable of forming a carbon film having higher electrical conductivity and strength. The fibrous carbon nanostructures more preferably have not undergone opening formation treatment and exhibit a convex upward shape in a t-plot. The t-plot can be obtained from the adsorption isotherm of the fibrous carbon nanostructures measured by the nitrogen gas adsorption method by converting the relative pressure to an average thickness t (nm) of an adsorbed layer of nitrogen gas. Specifically, an average adsorbed nitrogen gas layer thickness t corresponding to a given relative pressure is calculated from a known standard isotherm of average adsorbed nitrogen gas layer thickness t plotted against relative pressure P/PO and the relative pressure is converted to the corresponding average adsorbed nitrogen gas layer thickness t to obtain a t-plot for the fibrous carbon nanostructures (t-plot method of de Boer et al.).

In a substance having pores at its surface, the growth of the adsorbed layer of nitrogen gas is categorized into the following processes (1) to (3). The gradient of the t-plot changes in accordance with these processes (1) to (3):

(1) a process in which a single molecular adsorption layer is formed over the entire surface by nitrogen molecules;

(2) a process in which a multi-molecular adsorption layer is formed in accompaniment to capillary condensation filling of pores; and (3) a process in which a multi-molecular adsorption layer is formed on a surface that appears to be non-porous due to the pores being filled by nitrogen.

The t-plot forming a convex upward shape is on a straight line passing through the origin in a region in which the average adsorbed nitrogen gas layer thickness t is small, but, as t increases, the plot deviates downward from the straight line. The fibrous carbon nanostructures having such a t-plot shape indicate that the fibrous carbon nanostructures have a large internal specific surface area as a proportion of total specific surface area and that there are a large number of openings in the carbon nanostructures constituting the fibrous carbon nanostructures.

The bending point of the t-plot of the fibrous carbon nanostructures is preferably in a range satisfying 0.2≤t (nm)≤1.5, more preferably in a range of 0.45≤t (nm)≤1.5, and further preferably in a range of 0.55≤t (nm)≤1.0.

Herein, the "position of the bending point" is an intersection point of an approximated straight line A for the above-mentioned process (1) and an approximated straight line B for the above-mentioned process (3).

The fibrous carbon nanostructures preferably have a ratio of an internal specific surface area S2 to a total specific surface area S1 (S2/S1) of 0.05 or more and 0.30 or less, obtained from the t-plot.

Each of the total specific surface area Si and the internal specific surface area S2 of the fibrous carbon nanostructures is not limited, but S1 is preferably 400 m²/g or more and 2500 m²/g or less and further preferably 800 m²/g or more and 1200 m²/g or less, and S2 is preferably 30 m²/g or more and 540 m²/g or less.

The total specific surface area S1 and the internal specific surface area S2 of the fibrous carbon nanostructures can be found from the t-plot. First, the total specific surface area S1 can be found from the gradient of the approximated straight line corresponding to the process (1) and an external specific surface area S3 can be found from the gradient of the approximated straight line corresponding to the process (3). The internal specific surface area S2 can then be calculated by subtracting the external specific surface area S3 from the total specific surface area S1.

The measurement of the adsorption isotherm, the preparation of the t-plot, and the calculation of the total specific surface area Si and the internal specific surface area S2 based on t-plot analysis for the fibrous carbon nanostructures can be performed using, for example, BELSORP®-mini, a commercially available measurement instrument available from Bel Japan Inc.

The above-described fibrous carbon nanostructures can be efficiently produced, for example, according to the method (super growth method, see WO2006/011655) wherein during synthesis of CNTs through chemical vapor deposition (CVD) by supplying a feedstock compound and a carrier gas onto a substrate having thereon a catalyst layer for carbon nanotube production, the catalytic activity of the catalyst layer is dramatically improved by providing a trace amount of an oxidizing agent (catalyst activating material) in the system. Hereinafter, carbon nanotubes obtained by the super growth method as the above-described fibrous carbon nanostructures are also referred to as "SGCNTs."

The fibrous carbon nanostructures may be composed solely of SGCNTs, or may be composed of SGCNTs and non-cylindrical carbon nanostructures. Specifically, the fibrous carbon nanostructures may include single- or multi-walled flattened cylindrical carbon nanostructures having over the entire length a tape portion where inner walls are in close proximity to each other or bonded together (hereinafter such carbon nanostructures are also referred to as "graphene nanotapes (GNTs)").

GNT is presumed to be a substance having over the entire length a tape portion where inner walls are in close proximity to each other or bonded together since it has been synthesized, and having a network of 6-membered carbon rings in the form of flattened cylindrical shape. GNT's flattened cylindrical structure and the presence of a tape portion where inner walls are in close proximity to each other or bonded together in the GNT can be confirmed, for example, as follows: GNT and fullerene (C60) are sealed into a quartz tube and subjected to heat treatment under reduced pressure (fullerene insertion treatment) to form a fullerene-inserted GNT, followed by observation under a transmission electron microscope (TEM) of the fullerene-inserted GNT to confirm the presence of part in the GNT where no fullerene is inserted (tape portion).

The shape of the GNT is preferably such that it has a tape portion at the central part in the width direction. More preferably, the shape of a cross-section of the GNT, perpendicular to the extending direction (axial direction), is such that the maximum dimension in a direction perpendicular to the longitudinal direction of the cross section is larger in the vicinity of opposite ends in the longitudinal direction of the cross section than in the vicinity of the central part in the longitudinal direction of the cross section. Most preferably, a cross-section of the GNT perpendicular to the extending direction (axial direction) has a dumbbell shape.

The term "vicinity of the central part in the longitudinal direction of a cross section" used for the shape of a cross section of GNT refers to a region within 30% of longitudinal dimension of the cross section from the line at the longitudinal center of the cross section (i.e., a line that passes through the longitudinal center of the cross section and is perpendicular to the longitudinal line in the cross section). The term "vicinity of opposite ends in the longitudinal direction of a cross section" refers to regions outside the "vicinity of the central part in the longitudinal direction of a cross section" in the longitudinal direction.

Fibrous carbon nanostructures including GNTs as non-cylindrical carbon nanostructures can be obtained by, when synthesizing CNTs by the super growth method using a substrate having thereon a catalyst layer (hereinafter also referred to as a "catalyst substrate"), forming the catalyst substrate using a specific method. Specifically, fibrous carbon nanostructures including GNTs can be obtained through synthesis of CNTs by the super growth method using a catalyst substrate prepared as follows: Coating liquid A containing an aluminum compound is applied on a substrate and dried to form an aluminum thin film (catalyst support layer) on the substrate, followed by application of coating liquid B containing an iron compound on the aluminum thin film and drying of the coating liquid B at a temperature of 50° C. or less to form an iron thin film (catalyst layer) on the aluminum thin film.

The tap density of the fibrous carbon nanostructures is 0.024 g/cm$^3$ or less, and is preferably 0.008 g/cm$^3$ to 0.020 g/cm$^3$ and more preferably 0.012 g/cm$^3$ to 0.016 g/cm$^3$, in terms of limiting aggregation and enabling obtainment of a dispersion liquid having excellent dispersibility of fibrous carbon nanostructures.

Herein, the tap density is a value measured in accordance with JIS Z2512.

The concentration of metal impurities contained in the fibrous carbon nanostructures is preferably less than $1\times10^{18}$ atoms/cm$^3$ and more preferably less than $15\times10^{10}$ atoms/cm$^3$, in terms of reducing impurities in the fibrous carbon nanostructure dispersion liquid and further improving the dispersibility of the fibrous carbon nanostructures.

Herein, the concentration of metal impurities can be measured, for example, by a transmission electron microscope (TEM), a scanning electron microscope (SEM), X-ray fluorescence analysis (XRF), energy dispersive X-ray analysis (EDAX), a vapor-phase decomposition device and ICP mass spectrometry (VPD, ICP/MS), etc.

Herein, metal impurities include, for example, a metal catalyst used in the production of the fibrous carbon nanostructures. Examples include metal elements to which alkali metal, alkaline-earth metal, groups 3 to 13, and lanthanoid group belong, metal elements such as Si, Sb, As, Pb, Sn, and Bi, and metal compounds containing these elements. More specific examples include metal elements such as Al, Sb, As, Ba, Be, Bi, B, Cd, Ca, Cr, Co, Cu, Ga, Ge, Fe, Pb, Li, Mg, Mn, Mo, Ni, K, Na, Sr, Sn, Ti, W, V, Zn, and Zr, and metal compounds containing these elements.

In terms of further improving the dispersibility of the fibrous carbon nanostructures in the fibrous carbon nanostructure dispersion liquid, the fibrous carbon nanostructures preferably do not substantially contain particulate impurities with a particle diameter of more than 500 nm, more preferably do not substantially contain particulate impurities with a particle diameter of more than 300 nm, further preferably do not substantially contain particulate impurities with a particle diameter of more than 100 nm, and particularly preferably do not substantially contain particulate impurities with a particle diameter of more than 45 nm.

As used herein, the concentration of particulate impurities can be measured by applying a fibrous carbon nanostructure dispersion liquid onto a substrate and measuring the surface using, for example, "surfscan" produced by KLA Tencor Corporation.

<Solvent>

The solvent may be, for example, a non-halogen solvent or a non-aqueous solvent. Examples of the solvent include: water; alcohols such as methanol, ethanol, n-propanol, isopropanol, n-butanol, isobutanol, t-butanol, pentanol, hexanol, heptanol, octanol, nonanol, decanol, amyl alcohol, methoxy propanol, propylene glycol, and ethylene glycol; ketones such as acetone, methyl ethyl ketone, and cyclohexanone; esters such as ethyl acetate, butyl acetate, ethyl lactate, esters of α-hydroxy carboxylic acids, and benzyl benzoate; ethers such as diethyl ether, dioxane, tetrahydrofuran, and monomethyl ether; amide-based polar organic solvents such as N,N-dimethylformamide and N-methylpyrrolidone; aromatic hydrocarbons such as toluene, xylene, chlorobenzene, ortho-dichlorobenzene, and para-dichlorobenzene; and salicylaldehyde, dimethylsulfoxide, 4-methyl-2-pentanone, N-methylpyrrolidone, γ-butyrolactone, and tetramethyl ammonium hydroxide, without being limited thereto. Of these, ethyl lactate or water is preferable, in terms of particularly excellent dispersibility. One of these solvents may be used individually, or two or more of these solvents may be used as a mixture.

Regarding the concentration of the fibrous carbon nanostructures in the fibrous carbon nanostructure dispersion liquid in this embodiment, the content of the fibrous carbon nanostructures relative to 1 L of the solvent is preferably 1 mg or more and more preferably 100 mg or more, and preferably 1200 mg or less. If the content of the fibrous carbon nanostructures relative to the solvent is 1 mg or more, a carbon film having excellent electrical conductivity and strength can be formed. If the content of the fibrous carbon nanostructures is 1200 mg or less, aggregation of fibrous carbon nanostructures can be suppressed to obtain a dispersion liquid having better dispersibility of fibrous carbon nanostructures.

The concentration of the fibrous carbon nanostructures in the fibrous carbon nanostructure dispersion liquid in this embodiment is preferably 0.005 mass % or more and more preferably 0.01 mass % or more, and preferably 5 mass % or less and more preferably 0.5 mass % or less. If the concentration of the fibrous carbon nanostructures is 0.005 mass % or more, a carbon film having excellent electrical conductivity and strength can be formed. If the concentration of the fibrous carbon nanostructures is 5 mass % or less, aggregation of fibrous carbon nanostructures can be suppressed to obtain a dispersion liquid having better dispersibility of fibrous carbon nanostructures.

Preferably, the fibrous carbon nanostructure dispersion liquid in this embodiment substantially does not contain a dispersant. As used herein, "substantially not containing" means not actively containing except inevitable mixing. Specifically, its content in the fibrous carbon nanostructure dispersion liquid is preferably less than 0.05 mass %, more preferably less than 0.01 mass %, and further preferably less than 0.001 mass %.

Examples of the dispersant include a surfactant, a synthetic polymer, and a natural polymer.

Examples of the surfactant include sodium dodecylsulfonate, sodium deoxycholate, sodium cholate, and sodium dodecylbenzenesulfonate.

Examples of the synthetic polymer include polyether diol, polyester diol, polycarbonate diol, polyvinyl alcohol, partially saponified polyvinyl alcohol, acetoacetyl group-modified polyvinyl alcohol, acetal group-modified polyvinyl alcohol, butyral group-modified polyvinyl alcohol, silanol group-modified polyvinyl alcohol, ethylene-vinyl alcohol copolymer, ethylene-vinyl alcohol-vinyl acetate copolymer resin, dimethylaminoethyl acrylate, dimethylaminoethyl methacrylate, acrylic resin, epoxy resin, modified epoxy resin, phenoxy resin, modified phenoxy-based resin, phenoxy ether resin, phenoxy ester resin, fluorine-based resin, melamine resin, alkyd resin, phenolic resin, polyacrylamide, polyacrylic acid, polystyrene sulfonic acid, polyethylene glycol, and polyvinylpyrrolidone.

Examples of the natural polymer include polysaccharides such as starch, pullulan, dextran, dextrin, guar gum, xanthan gum, amylose, amylopectin, alginic acid, arabic gum, carrageenan, chondroitin sulfate, hyaluronic acid, curdlan, chitin, chitosan, cellulose, and salts or derivatives thereof.

Preferably, the fibrous carbon nanostructure dispersion liquid in this embodiment substantially does not contain particles with a number-based mode diameter of more than 500 nm, in terms of forming a film structure having a smooth surface and containing nanostructures uniformly. Particularly preferably, the fibrous carbon nanostructure dispersion liquid substantially does not contain particles with a number-based mode diameter of more than 300 nm.

As used herein, the number-based mode diameter can be calculated by the following method.

The particle diameters of the fibrous carbon nanostructures contained in the fibrous carbon nanostructure dispersion liquid are measured using a dynamic light scattering type particle size distribution measurement device (manufactured by Malvern Instruments Ltd. (U.K.), model "Zetasizer Nano ZS", etc.). A particle diameter distribution curve with the horizontal axis representing the particle diameter and the vertical axis representing the number of fibrous carbon nanostructures was then obtained, and the particle diameter at its maximum is taken to be the number-based mode diameter of the fibrous carbon nanostructures.

The mode diameter of the fibrous carbon nanostructures contained in the fibrous carbon nanostructure dispersion liquid may be optionally changed by adjusting the production conditions of the fibrous carbon nanostructures or the fibrous carbon nanostructure dispersion liquid.

In the fibrous carbon nanostructure dispersion liquid in this embodiment, the concentration of metal impurities is preferably less than $1 \times 10^{18}$ atoms/cm$^3$ and more preferably less than $15 \times 10^{10}$ atoms/cm$^3$, in terms of further improving the dispersibility of fibrous carbon nanostructures and improving the carbon purity of the formed film.

In the fibrous carbon nanostructure dispersion liquid in this embodiment, the concentration of heavy metal impurities is preferably less than $1 \times 10^{18}$ atoms/cm$^3$ and more preferably less than $1 \times 10^{11}$ atoms/cm$^3$, in terms of further improving the dispersibility of fibrous carbon nanostructures and improving the carbon purity of the formed film.

As used herein, heavy metal refers to metal with a specific gravity of 5 g/mL or more.

In the fibrous carbon nanostructure dispersion liquid in this embodiment, the concentration of impurities of group 1 elements and group 2 elements is preferably less than $1 \times 10^{18}$ atoms/cm$^3$ and more preferably less than $1 \times 10^{11}$ atoms/cm$^3$, in terms of further improving the dispersibility of fibrous carbon nanostructures and improving the carbon purity of the formed film.

In the fibrous carbon nanostructure dispersion liquid in this embodiment, the concentration of impurities of transition metal elements is preferably less than $1 \times 10^{18}$ atoms/cm$^3$ and more preferably less than $1 \times 10^{11}$ atoms/cm$^3$, in terms of further improving the dispersibility of fibrous carbon nanostructures and improving the carbon purity of the formed film.

Preferably, the fibrous carbon nanostructure dispersion liquid in this embodiment substantially does not contain a precipitate and an aggregate of the fibrous carbon nanostructures, in terms of further improving the dispersibility of the fibrous carbon nanostructures.

As used herein, "precipitate" refers to fibrous carbon structures that precipitate with a centrifugal force of 3000 G or more, and "aggregate" refers to black fibrous nanostructures visually recognizable in the liquid and fibrous carbon structures whose number-based mode diameter measured by a laser diffraction type particle size distribution meter is 1 μm or more.

The fibrous carbon nanostructure dispersion liquid in this embodiment preferably does not substantially contain particulate impurities with a particle diameter of more than 300 nm, more preferably does not substantially contain particulate impurities with a particle diameter of more than 100 nm, and further preferably does not substantially contain particulate impurities with a particle diameter of more than 45 nm, in terms of ensuring the flatness and uniformity of the formed film.

Herein, the particle diameter and concentration of particulate impurities can be measured by applying a fibrous carbon nanostructure dispersion liquid onto a substrate and observing the surface using, for example, "surfscan" manufactured by KLA Tencor Corporation.

<Physical Properties>

The viscosity of the fibrous carbon nanostructure dispersion liquid in this embodiment is preferably 1 mPa·s or more and more preferably 2 mPa·s or more, and preferably 1000 mPa·s or less and more preferably 100 mPa·s or less. If the viscosity of the fibrous carbon nanostructure dispersion liquid is 1 mPa·s or more and 1000 mPa·s or less, excellent film formability when forming a film from the fibrous carbon nanostructures can be achieved.

As used herein, the "viscosity of the fibrous carbon nanostructure dispersion liquid" can be measured at a temperature of 25° C. in accordance with JIS Z8803.

The absorbance of the fibrous carbon nanostructure dispersion liquid in this embodiment measured using a spectrophotometer is, at an optical path length of 0.1 mm and a wavelength of 1000 nm, preferably 0.1 or more and more preferably 0.2 or more, and preferably 5.0 or less and more preferably 3.0 or less, in terms of dispersibility. If the absorbance of the fibrous carbon nanostructure dispersion liquid is 0.1 or more, a sufficient amount of fibrous carbon nanostructures in the fibrous carbon nanostructure dispersion liquid can be ensured. If the absorbance of the fibrous carbon nanostructure dispersion liquid is 5.0 or less, the proportion of fibrous carbon nanostructures with high dispersibility contained in the fibrous carbon nanostructure dispersion liquid can be increased, and a carbon film having excellent electrical conductivity and strength can be formed.

The absorbance ratio of the fibrous carbon nanostructure dispersion liquid in this embodiment is preferably 0.5 or more and more preferably 0.7 to 0.9, in terms of high purity with few aggregates and also excellent dispersibility of fibrous carbon nanostructures.

As used herein, "absorbance ratio" can be measured by the method described in the "absorbance ratio" the below-mentioned evaluation.

<Applications>

The fibrous carbon nanostructure dispersion liquid in this embodiment can be used in the production of: electronic components such as electronic circuits including logic circuits, memory including DRAM, SRAM, NOR flash, NAND flash, ReRAM, and STT-RAM, semiconductor devices, interconnects, complementary MOS, and bipolar transistors; chemical sensors such as trace gas detectors; biosensors such as measuring instruments for DNA, protein, and the like; conductive films such as solar cells and touch panels; and electronic products such as organic EL displays and liquid crystal displays. For example, the fibrous carbon nanostructure dispersion liquid is usable as a coating liquid or a constituent material in the production of an electronic product. Of these, the fibrous carbon nanostructure dispersion liquid is suitable as a constituent material of a semiconductor device, in terms of enabling obtainment of a product having excellent electrical conductivity and strength.

(Method of Producing Fibrous Carbon Nanostructure Dispersion Liquid)

A method of producing a fibrous carbon nanostructure dispersion liquid in this embodiment is, for example, a method including: a step of performing centrifugal separation on a dispersion mixed solution containing a plurality of fibrous carbon nanostructures and a solvent, to precipitate part of the plurality of fibrous carbon nanostructures (centrifugal separation step); and a step of isolating a supernatant from the dispersion mixed solution that has undergone the centrifugal separation in the centrifugal separation step (isolation step). Before the centrifugal separation step, a step of performing, on a coarse dispersion liquid obtained by adding the plurality of fibrous carbon nanostructures to the solvent, dispersion treatment to obtain the dispersion mixed solution (dispersion mixed solution production step) may be provided.

In the method of producing a fibrous carbon nanostructure dispersion liquid in this embodiment, for example, a large amount of fibrous carbon nanostructures may be added to the solvent to form the coarse dispersion liquid, and the coarse dispersion liquid is stirred and dispersed by ultrasound or the like to yield the dispersion mixed solution. The stirred dispersion mixed solution that has undergone the ultrasonic treatment may be subjected to centrifugal separation to collect the supernatant containing fibrous carbon nanostructures. A solvent may be added again to the precipitate after the centrifugal separation and mixed, and the mixture may be subjected to ultrasonic treatment for dispersion, after which centrifugal separation is performed to collect the supernatant containing fibrous carbon nanostructures. A process of adding a solvent to the precipitate after the centrifugal separation, mixing them, dispersing them by ultrasonic treatment, and then performing centrifugal separation to collect the supernatant may be repeatedly performed a plurality of times.

With such a method of producing a fibrous carbon nanostructure dispersion liquid, a dispersion liquid having excellent dispersibility of fibrous carbon nanostructures with few aggregated fibrous carbon nanostructures or impurities can be yielded.

<Dispersion Mixed Solution Production Step>

In the dispersion mixed solution production step, the coarse dispersion liquid obtained by adding the plurality of fibrous carbon nanostructures to the solvent is subjected to dispersion treatment, as a result of which the dispersion mixed solution containing the plurality of fibrous carbon nanostructures and the solvent can be yielded.

The dispersion mixed solution may be prepared without performing the dispersion mixed solution production step, i.e. the below-mentioned centrifugal separation step may be performed using a commercially available dispersion mixed solution of fibrous carbon nanostructures obtained by dispersing a plurality of fibrous carbon nanostructures in a solvent. In terms of easily obtaining a fibrous carbon nanostructure dispersion liquid having desired dispersibility, however, it is preferable to use the dispersion mixed solution produced by performing the dispersion mixed solution production step.

The fibrous carbon nanostructures to be added to the solvent may be subjected to pretreatment before the addition, in order to separate particulate impurities such as metal and amorphous carbon and reduce alkali metal ions, halogen ions, oligomers, and polymers.

Examples of purification treatment for separating metal include purification treatment of dispersing fibrous carbon nanostructures in an acid solution of nitric acid, hydrochloric acid, or the like and dissolving metal impurities, and magnetic purification treatment. Of these, purification treatment of dispersing fibrous carbon nanostructures in an acid solution and dissolving metal impurities is preferable.

Examples of pretreatment as purification treatment for separating particulate impurities include: high-speed centrifugal treatment using an ultrahigh-speed centrifuge or the like; filtration treatment by gravity filtration, cross flow filtration, vacuum filtration, or the like; non-fullerene carbon material selective oxidation; and combinations thereof.

[Coarse Dispersion Liquid]

The coarse dispersion liquid may be obtained by mixing the fibrous carbon nanostructures and the solvent by a known method, without being limited thereto. The fibrous carbon nanostructures and the solvent may be mixed in any order. In addition to the above-mentioned components, additives typically used in the production of fibrous carbon nanostructure dispersion liquids may be further added to the coarse dispersion liquid.

The dispersion mixed solution preferably does not contain a surfactant and a polymer of resin and the like.

[Dispersion Treatment]

The dispersion treatment method when subjecting the coarse dispersion liquid to dispersion treatment to produce the dispersion mixed solution may be, but is not limited to, a known dispersion treatment method used for dispersion of a fibrous carbon nanostructure-containing liquid. In particular, dispersion treatment that brings about a cavitation effect or dispersion treatment that brings about a crushing effect is preferable as the dispersion treatment performed on the coarse dispersion liquid. The use of dispersion treatment that brings about a cavitation effect or dispersion treatment that brings about a crushing effect enables favorable dispersion of fibrous carbon nanostructures, and further enhances the dispersibility of the resultant fibrous carbon nanostructure dispersion liquid.

[[Dispersion Treatment That Brings About Cavitation Effect]]

The dispersion treatment that brings about a cavitation effect is a dispersion method that utilizes shock waves caused by the rupture of vacuum bubbles formed in water when high energy is applied to the liquid. This dispersion method can be used to favorably disperse the fibrous carbon nanostructures.

Specific examples of the dispersion treatment that brings about a cavitation effect include dispersion treatment using ultrasound, dispersion treatment using a jet mill, and dispersion treatment using high-shear stirring. One of these dispersion treatments may be carried out or a plurality of these dispersion treatments may be carried out in combination. More specifically, an ultrasonic homogenizer, a jet mill, and a high-shear stirring device are preferably used. Commonly known conventional devices may be used as these devices.

In a situation in which the dispersion of the fibrous carbon nanostructures is performed using an ultrasonic homogenizer, the coarse dispersion liquid is irradiated with ultrasound by the ultrasonic homogenizer. The irradiation time may be set as appropriate in consideration of the amount of fibrous carbon nanostructures and so forth. For example, the irradiation time is preferably 3 minutes or more and more preferably 30 minutes or more, and preferably 5 hours or less and more preferably 2 hours or less. For example, the output is preferably 20 W or more and 500 W or less, and more preferably 100 W or more and 500 W or less. The temperature is preferably 15° C. or more and 50° C. or less.

In a situation in which a jet mill is used, the number of treatment repetitions carried out is set as appropriate in consideration of the amount of fibrous carbon nanostructures and so forth. For example, the number of treatment repetitions is preferably at least 2 repetitions, and is preferably no greater than 100 repetitions, and more preferably no greater than 50 repetitions. For example, the pressure is preferably 20 MPa or more and 250 MPa or less, and the temperature is preferably 15° C. or more and 50° C. or less.

In a situation in which a high-shear stirring device is used, the coarse dispersion liquid is subjected to stirring and shearing using a high-shear stirring device. The rotational speed is preferably as fast as possible. The operating time (i.e., the time during which the device is rotating) is preferably 3 min or more and 4 hr or less, the circumferential speed is preferably 5 m/sec or more and 50 m/sec or less, and the temperature is preferably 15° C. or more and 50° C. or less.

The dispersion treatment that brings about a cavitation effect is more preferably performed at a temperature of 50° C. or less. This suppresses a change in concentration due to solvent volatilization.

[[Dispersion Treatment That Brings About Crushing Effect]]

Dispersion treatment that brings about a crushing effect is even more advantageous because, in addition to enabling uniform dispersion of the fibrous carbon nanostructures in the solvent, dispersion treatment that brings about a crushing effect reduces damage to the fibrous carbon nanostructures due to shock waves when air bubbles burst compared to the above-mentioned dispersion treatment that brings about a cavitation effect.

The dispersion treatment that brings about a crushing effect uniformly disperses the fibrous carbon nanostructures in the solvent by causing crushing and dispersion of aggregates of the fibrous carbon nanostructures by imparting shear force to the coarse dispersion liquid and by further applying back pressure to the coarse dispersion liquid, while cooling the coarse dispersion liquid as necessary in order to reduce air bubble formation.

When applying back pressure to the coarse dispersion liquid, the back pressure may be applied to the coarse dispersion liquid by lowering pressure at once to atmospheric pressure, yet the pressure is preferably lowered over multiple steps.

In order to further disperse the fibrous carbon nanostructures in the coarse dispersion liquid by applying a shear force to the coarse dispersion liquid, a dispersion system including a disperser with the structure below, for example, may be used.

From the side where the coarse dispersion liquid flows in to the side where the coarse dispersion liquid flows out, the disperser is sequentially provided with a disperser orifice having an inner diameter d1, a dispersion space having an inner diameter d2, and a terminal section having an inner diameter d3 (where d2>d3>d1).

In this disperser, by passing through the disperser orifice, high-pressure (e.g. 10 MPa to 400 MPa, preferably 50 MPa to 250 MPa) coarse dispersion liquid that flows in is reduced in pressure while becoming a high flow rate fluid that then flows into the dispersion space. Subsequently, the high flow rate coarse dispersion liquid that has entered the dispersion space flows in the dispersion space at high speed, receiving a shear force at that time. As a result, the flow rate of the coarse dispersion liquid decreases, and the fibrous carbon nanostructures are dispersed well. A fluid at a lower pressure (back pressure) than the pressure of the in-flowing coarse dispersion liquid then flows out from the terminal section, yielding the dispersion liquid of the fibrous carbon nanostructures.

The back pressure of the coarse dispersion liquid may be applied to the coarse dispersion liquid by applying a load to the flow of the coarse dispersion liquid. For example, a desired back pressure may be applied to the coarse dispersion liquid by providing a multiple step-down device downstream from the disperser.

With this multiple step-down device, the back pressure of the coarse dispersion liquid is lowered over multiple steps, so that when the dispersion mixed solution is ultimately released into atmospheric pressure, the occurrence of air bubbles in the dispersion mixed solution can be suppressed.

The disperser may be provided with a heat exchanger or a cooling liquid supply mechanism for cooling the coarse dispersion liquid. The reason is that by cooling the coarse dispersion liquid that is at a high temperature due to the application of a shear force in the disperser, the generation of air bubbles in the coarse dispersion liquid can be further suppressed.

Instead of providing a heat exchanger or the like, the generation of air bubbles in the liquid containing the fibrous carbon nanostructures can also be suppressed by cooling the coarse dispersion liquid in advance.

As described above, in this dispersion treatment that brings about a crushing effect, the occurrence of cavitation can be suppressed, thereby suppressing damage to the fibrous carbon nanostructures due to cavitation, which is sometimes a concern. In particular, damage to the fibrous carbon nanostructures due to shock waves when the air bubbles burst can be suppressed. Additionally, adhesion of air bubbles to the fibrous carbon nanostructures and energy loss due to the generation of air bubbles can be suppressed, and the fibrous carbon nanostructures can also be effectively dispersed evenly.

Examples of a dispersion system having the above structure include the product name "BERYU SYSTEM PRO" (manufactured by BeRyu Corporation). Dispersion treatment that brings about a crushing effect may be performed by using such a dispersion system and appropriately controlling the dispersion conditions.

<Centrifugal Separation Step>

In the centrifugal separation step, the dispersion mixed solution containing the plurality of fibrous carbon nanostructures and the solvent is subjected to centrifugal separation, so that part of the plurality of fibrous carbon nanostructures can be precipitated. In the centrifugal separation step, fibrous carbon nanostructures with high aggregability precipitate, and fibrous carbon nanostructures with excellent dispersibility remain in the supernatant.

The centrifugal separation of the dispersion mixed solution may be performed using a known centrifugal separator, without being limited thereto.

In terms of causing fibrous carbon nanostructures having excellent dispersibility to adequately remain in the supernatant to yield a fibrous carbon nanostructure dispersion liquid having excellent dispersibility, the centrifugal acceleration in the centrifugal separation of the dispersion mixed solution is preferably 2000 G or more and more preferably 10000 G or more, and preferably 100000 G or less and more preferably 80000 G or less.

In terms of causing fibrous carbon nanostructures having excellent dispersibility to adequately remain in the supernatant to yield a fibrous carbon nanostructure dispersion liquid having excellent dispersibility, the centrifugal separation time in the centrifugal separation of the dispersion mixed solution is preferably 15 min or more and more preferably 30 min or more, and preferably 120 min or less and more preferably 90 min or less.

<Isolation Step>

In the isolation step, the supernatant can be isolated from the dispersion mixed solution that has undergone the centrifugal separation in the centrifugal separation step. For example, the isolation of the supernatant may be performed by collecting the supernatant while leaving the precipitation layer through decantation, pipetting, or the like. Specifically, the supernatant present up to a position of ⅚ in depth from the liquid surface of the dispersion mixed solution after the centrifugal separation may be collected.

[Supernatant]

The supernatant isolated from the dispersion mixed solution after the centrifugal separation contains fibrous carbon nanostructures not precipitated by the centrifugal separation. This supernatant can be used as the fibrous carbon nanostructure dispersion liquid in this embodiment.

EXAMPLES

The following provides a more specific description of the present disclosure based on examples. However, the present disclosure is not limited to the following examples. In the following description, "%" used in expressing quantities is by mass, unless otherwise specified.

Example 1

CNTs (SGCNTs) were prepared by the super growth method in accordance with the description in WO 2006/011655. In the preparation of the SGCNTs, formation of a catalyst layer on the surface of a substrate was performed by a wet process and a feedstock gas having acetylene as a main component was used.

The resultant SGCNTs had a BET specific surface area of 1,050 m$^2$/g (closed), a micropore volume of 0.44 mL/g, and when measured using a Raman spectrophotometer, exhibited a radial breathing mode (RBM) spectrum in a low wavenumber region from 100 cm$^{-1}$ to 300 cm$^{-3}$, which is characteristic of single-walled CNTs. Moreover, as a result of measuring the diameters and the lengths of 100 randomly selected SGCNTs using a transmission electron microscope, it was found that the average diameter (Av) was 3.3 nm, the diameter standard deviation (σ) multiplied by 3 (3σ) was 1.9 nm, the ratio (3σ/Av) thereof was 0.58, and the average length was 500 μm. The tap density of the SGCNTs measured in accordance with JIS Z2512 was 0.018 g/cm$^3$. The t-plot of the SGCNTs measured exhibited a convex upward shape.

18000 mg of the obtained SGCNTs were stirred in 5 L of HNO$_3$ of 7.7 M for 8 hours, and refluxed at 125° C. for 12 hours, to perform purification. After this, 25 L of deionized water was added and dilution was performed. After the dilution, a ceramic film of 0.05 μm was used to perform cross flow filtration until the pH reached 4.0. Liquid that had passed through the ceramic film was discarded as transmitted liquid, and liquid that had not passed through the pores of the filter was collected as retained liquid. Thereafter, 0.1% ammonia water was added to the retained liquid, to readjust the pH of the retained liquid to 7.1. Ultrasonic treatment was then performed at 42 Hz for 120 minutes using an ultrasonic irradiator (manufactured by Branson Ultrasonics, Emerson Japan, Ltd., product name "BRANSON5510"). Thereafter, a cycle of performing centrifuging using a centrifugal separator (manufactured by Beckman Coulter Inc., product name "OPTIMA XL100K") at 20000 G for 40 minutes and collecting a supernatant was repeatedly performed three times, thus obtaining 20 L of a CNT dispersion liquid.

Example 2

As a result of producing CNTs in the range described in Example 1, CNTs with a tap density of 0.015 g/cm$^3$ were obtained. RBM was observed. Moreover, as a result of measuring the diameters and the lengths of 100 randomly selected SGCNTs using a transmission electron microscope, it was found that the average diameter (Av) was 3.1 nm, the diameter standard deviation (σ) multiplied by 3 (3σ) was 1.8 nm, the ratio (3σ/Av) thereof was 0.58, and the average length was 280 μm. The CNTs were used to produce a CNT dispersion liquid by the same method as in Example 1.

Comparative Example 1

A fibrous carbon nanostructure dispersion liquid was produced in the same way as in Example 1, except that CNTs with a tap density of 0.1 g/cm$^3$ (manufactured by NanoIntegris, HiPco Superpure grade) were used as fibrous carbon nanostructures. The resultant fibrous carbon nanostructure dispersion liquid was 19 L.

[Evaluation]

Absorbance Ratio 21 mg of the fibrous carbon nanostructures before the purification pretreatment used in the examples and comparative example were added to 10 mL of ethyl lactate, and a fibrous carbon nanostructure dispersion liquid was produced in the same way as in Example 1. Using a fibrous carbon nanostructure dispersion liquid that had not undergone the purification pretreatment (non-purification-treated dispersion liquid) and a fibrous carbon nanostructure dispersion liquid obtained in the examples and comparative example that had undergone the purification pretreatment (purification-treated dispersion liquid), the absorbance at an optical path length of 0.01 cm and a wavelength of 550 nm was measured using a spectrophotometer (manufactured by JASCO Corporation, product name "V670").

The absorbance ratio was then calculated according to the following formula:

absorbance ratio=(absorbance of purification-treated dispersion liquid)/(absorbance of non-purification-treated dispersion liquid).

In addition, the amount of metal impurities was measured for the purification-treated dispersion liquid by ICP mass spectrometry, and whether or not aggregates were present was observed by an optical microscope (magnification: 500).

TABLE 1

|  |  | Example 1 | Example 2 | Comparative Example 1 |
|---|---|---|---|---|
|  | Tap density (g/cm$^3$) | 0.018 | 0.015 | 0.1 |
| Absorbance | Absorbance of non-purification-treated dispersion liquid | 1.34 | 1.42 | 0.970 |
|  | Absorbance of purification-treated dispersion liquid | 0.95 | 0.99 | 0.315 |
|  | Absorbance ratio | 0.71 | 0.70 | 0.32 |
| Metal impurities | atoms/cm$^3$ | 10$^8$ | 10$^{14}$ | 10$^{18}$ |
|  | Aggregates | Substantially not observed | Substantially not observed | Observed |

As shown in Table 1, each fibrous carbon nanostructure dispersion liquid containing fibrous carbon nanostructures with a tap density of 0.024 g/cm$^3$ or less as in Examples 1 and 2 resisted aggregation caused by purification pretreatment, and had an absorbance ratio of 0.5 or more. Moreover, high purity and excellent dispersibility of fibrous carbon nanostructures were achieved. Further, the concentration of metal impurities was less than 15×10$^{10}$ atoms/cm$^3$.

INDUSTRIAL APPLICABILITY

It is thus possible to provide a fibrous carbon nanostructure dispersion liquid having excellent dispersibility of fibrous carbon nanostructures.

The invention claimed is:

1. A fibrous carbon nanostructure dispersion liquid consisting of:
   fibrous carbon nanostructures with a tap density of not more than 0.018 g/cm$^3$; and
   a solvent,
   wherein a concentration of metal impurities is less than 15×10$^{10}$ atoms/cm$^3$,
   wherein a content of a precipitate and an aggregate of the fibrous carbon nanostructures in the fibrous carbon nanostructure dispersion liquid is less than 0.05 mass %, and
   wherein the precipitate is fibrous carbon structures that precipitate with a centrifugal force of 3000 G or more and the aggregate is black fibrous nanostructures visually recognizable in the dispersion liquid and fibrous carbon structures whose number-based mode diameter measured by a laser diffraction type particle size distribution meter is 1 μm or more.

2. The fibrous carbon nanostructure dispersion liquid according to claim 1, wherein a concentration of the fibrous carbon nanostructures in 1 L of the solvent is 1 mg/L or more.

3. The fibrous carbon nanostructure dispersion liquid according to claim 1, wherein a content of particles with a number-based mode diameter of more than 500 nm in the fibrous carbon nanostructure dispersion liquid is less than 0.05 mass %.

4. The fibrous carbon nanostructure dispersion liquid according to claim 3, wherein a content of particles with a number-based mode diameter of more than 300 nm in the fibrous carbon nanostructure dispersion liquid is less than 0.05 mass %.

5. The fibrous carbon nanostructure dispersion liquid according to claim 1, being used as a constituent material of a semiconductor device.

6. The fibrous carbon nanostructure dispersion liquid according to claim 1, wherein the solvent includes water.

7. The fibrous carbon nanostructure dispersion liquid according to claim 1, wherein the tap density of the fibrous carbon nanostructures is not less than 0.008 g/cm$^3$.

* * * * *